(12) United States Patent
Choi et al.

(10) Patent No.: US 11,770,962 B2
(45) Date of Patent: Sep. 26, 2023

(54) DISPLAY CONFIGURATION FOR MOBILE COMPUTING DEVICES

(71) Applicant: GOOGLE LLC, Mountain View, CA (US)

(72) Inventors: Sangmoo Choi, Palo Alto, CA (US); Sun-il Chang, San Jose, CA (US); Jyothi Karri, San Jose, CA (US); Ion Bita, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 27 days.

(21) Appl. No.: 17/446,554

(22) Filed: Aug. 31, 2021

(65) Prior Publication Data
US 2021/0391391 A1     Dec. 16, 2021

Related U.S. Application Data

(63) Continuation of application No. PCT/US2019/065448, filed on Dec. 10, 2019.
(Continued)

(51) Int. Cl.
*H10K 59/40*     (2023.01)
*G06F 3/041*     (2006.01)
(Continued)

(52) U.S. Cl.
CPC ........... *H10K 59/40* (2023.02); *G06F 3/0412* (2013.01); *G09G 3/3225* (2013.01);
(Continued)

(58) Field of Classification Search
CPC .... G06F 1/1637; G06F 1/1686; G06F 3/0412; G09G 3/3225; G09G 2300/023;
(Continued)

(56) References Cited

U.S. PATENT DOCUMENTS 9,971,182 B2 * 5/2018 Zhou ................... H04M 1/0266
2011/0242058 A1 10/2011 Lee et al.
(Continued)

FOREIGN PATENT DOCUMENTS

CN    108874233     11/2018
EP     3226101 A1    10/2017
(Continued)

OTHER PUBLICATIONS

International Preliminary Report on Patentability in International Appln. No. PCT/US2019/065448, dated Sep. 16, 2021, 10 pages.
(Continued)

*Primary Examiner* — Nelson M Rosario
(74) *Attorney, Agent, or Firm* — Fish & Richardson P.C.

(57) ABSTRACT

A display configuration to extend the light emitting and touch sensitive portion of a display panel into areas normally reserved for other light devices is disclosed. In the configuration, light devices and the display panel are configured to operate together. The display panel may include an aperture through the display panel to provide an unobstructed light path to a light device. The display panel may also include a routing area to provide space for data lines feeding pixels to be rerouted around the aperture. The routing area is partially obstructed by data lines but otherwise transparent. Accordingly, some display devices may be positioned behind the routing area and still operate.

19 Claims, 9 Drawing Sheets

Related U.S. Application Data (60) Provisional application No. 62/813,490, filed on Mar. 4, 2019.

(51) Int. Cl.
  *G09G 3/3225* (2016.01)
  *H04M 1/02* (2006.01)
  *H10K 59/12* (2023.01)

(52) U.S. Cl.
  CPC .......... *H04M 1/0266* (2013.01); *H10K 59/12* (2023.02); *G09G 2360/14* (2013.01); *H04M 1/0264* (2013.01)

(58) Field of Classification Search
  CPC ........ G09G 2300/0426; G09G 2360/14; H01L 27/323; H01L 27/3244; H01L 27/3276; H04M 1/0264; H04M 1/0266
  See application file for complete search history.

(56) References Cited

U.S. PATENT DOCUMENTS

| | | | |
|---|---|---|---|
| 2018/0348929 A1 | 12/2018 | Rhe et al. | |
| 2020/0258957 A1* | 8/2020 | Kwak | G06F 1/1686 |
| 2021/0109398 A1* | 4/2021 | Son | G06F 1/1643 |

FOREIGN PATENT DOCUMENTS

| | | |
|---|---|---|
| EP | 3428967 | 1/2019 |
| KR | 10-2017-0024182 | 3/2017 |

OTHER PUBLICATIONS

International Search Report and Written Opinion for PCT Application PCT/US2019/065448, dated Feb. 25, 2020, 15 pages.

Office Action in European Appln. No. 19832790.0, dated Apr. 21, 2023, 14 pages.

* cited by examiner

DISPLAY CONFIGURATION FOR MOBILE COMPUTING DEVICES

CROSS-REFERENCE TO RELATED APPLICATION

This application is continuation of International Application No. PCT/US2019/065448, filed Dec. 10, 2019, and also claims the benefit of U.S. Provisional Application No. 62/813,490, filed on Mar. 4, 2019. The entire contents of both of the aforementioned applications are incorporated herein by reference in their entireties.

FIELD OF THE DISCLOSURE

The present disclosure relates to mobile computing devices and more specifically to a display configuration for a mobile computing device that enables a display area to encompass an area used by other devices.

BACKGROUND

A mobile computing device (e.g., smartphone, tablet, virtual assistant, etc.) may interact with a user in a variety of ways. Accordingly, a front (i.e., user facing) surface of the mobile computing device may be allocated to various devices performing various functions. A majority of the area of the front surface is typically allocated to a display (e.g., touch screen display) to enable easy viewing, while a separate area of the front surface is allocated to various other devices for gathering/providing audio and visual information. Increasing the area of the display without increasing the overall dimensions of mobile computing device is highly desirable; however, the separate area allocated for the various other devices limits the display from being extended towards the edges of the mobile computing device. A need, therefore, exists for a display configuration that enables the display area to be extended towards the edges of the mobile computing device without the need to relocate the various other devices, which could enlarge the mobile computing device.

SUMMARY

The disclosed approach facilitates extending a display panel over and around areas used by light devices. The disclosed approach eliminates the use of a large aperture in the display panel for the various other devices to reduce the size of a non-emissive area required for rerouting pixel data lines around the large aperture. Instead, the disclosed approach uses smaller apertures, with routing areas there between. The routing areas can provide space for rerouting pixel data lines and can provide partially obstructed light to light devices situated behind the routing areas.

In one general aspect, the present disclosure describes a mobile computing device. The mobile computing device includes a display panel with an emissive portion configured to emit light and a non-emissive portion configured to carry signals to the emissive portion. The mobile computing device further includes at least one light device positioned behind the display panel and configured to transmit or receive light through the non-emissive portion of the display panel.

In another general aspect, the present disclosure describes a display panel. The display panel includes an emissive portion that is configured to emit light. The emissive portion includes an organic light emitting diode (OLED) display structuring having (i) a matrix of OLEDs, (ii) a matrix of thin film transistors (TFTs), and (iii) data lines to carry signals for controlling the matrix of TFTs. The display panel also includes a routing area that is configured to carry signal for the emissive portion of the display panel. The routing area of the display has a simplified OLED display structure that includes data lines controlling the matrix TFTs. The routing area is partially obstructed by the data lines but is otherwise transparent so that light can pass partially obstructed through the routing area of the display panel to and from light devices positioned behind the routing area.

In another general aspect, the present disclosure describes a display panel. The display panel includes an emissive portion configured to emit light. The display panel also includes a non-emissive portion configured to carry signals to the emissive portion. The non-emissive portion of the display panel is configured to permit light transmitted or received by at least one light device positioned behind the display panel to pass through the non-emissive portion of the display panel.

The emissive portion may include a matrix of thin film transistors (TFTs) controlled by control lines to control light emission for pixels in the emissive portion. The control lines may comprise data lines and/or signal lines. The data lines may be column data lines. The signal lines may be gate signal lines.

The pixels may be organic light emitting diodes (OLEDs).

The non-emissive portion may include the control lines for pixels in the emissive portion but may not be configured to emit light. The control lines may partially obstruct the light transmitted or received through the non-emissive portion. The control lines may be data lines.

The non-emissive portion may include no pixels.

The non-emissive portion may include an aperture through the display panel and a routing area that surrounds the aperture and that includes control lines for the emissive portion. The control lines may be signal lines The light transmitted or received through the routing area may be partially obstructed by the control lines. The control lines may be signal lines.

The non-emissive portion may include a first aperture through the display panel and a second aperture through the display panel and a routing area that surrounds the first aperture and the second aperture.

The routing area may extend between the first aperture and the second aperture.

The routing area between the first aperture and the second aperture may include control lines for the emissive portion of the display panel rerouted around the first aperture or the second aperture. The control lines may be signal lines.

The light may be visible light, infrared light, or millimeter electromagnetic waves.

The emissive portion may have an OLED display structure that includes a matrix of organic light emitting diode (OLEDs), a matrix of thin film transistors (TFTs) controlling an intensity of the matrix of OLEDs, and control lines carrying signals for controlling the matrix of TFTs.

The non-emissive portion may comprise a routing area configured to carry signals for the emissive portion.

The routing area of the display panel may have a simplified OLED display structure that includes the control lines controlling the matrix TFTs. The control lines may be data lines.

The routing area may be partially obstructed by the control lines but otherwise transparent so light can pass partially obstructed through the routing area of the display panel to and from light devices.

The non-emissive area may be configured to be positioned over a light device operable with partially obstructed light.

The display panel may further include a plurality of apertures. Each of the plurality of apertures may be configured to be positioned over a light device operable with unobstructed light.

The display panel may further comprise a touch sensor including electrodes arranged in a pattern of unit cells, each unit cell larger than any of the plurality of apertures so no electrode enters an area defined by an aperture.

In another general aspect, the present disclosure there is provided a mobile computing device comprising a display panel described above. The a mobile computing device further comprises at least one light device positioned behind the display panel and configured to transmit or receive light through the non-emissive portion of the display panel.

The non-emissive portion may include an aperture through the display panel and a routing area that surrounds the aperture and that includes control lines for the emissive portion. One of the at least one light device may be configured to transmit or receive light through the aperture and another of the at least one light device may be configured to transmit or receive light through the routing area.

One of the at least one light device may be configured to transmit or receive light through the routing area between the first aperture and the second aperture. The light transmitted or received may be partially obstructed by the control lines between the first aperture and the second aperture. The control lines may be signal lines.

The at least one light device may include a light sensor.

The at least one light device may include a light emitter.

The at least one light device may comprise a camera.

In another general aspect, the present disclosure describes a method for providing light to a plurality of light devices in a mobile computing device. The method includes arranging the plurality of light devices so that light devices that are operable with partially obstructed light are positioned relative to (e.g., between) light devices that require unobstructed light. The method further includes positioning a display panel in front of the light devices so that the light devices that require unobstructed light are aligned with apertures in the display panel and so that light devices that are operable with partially obstructed light are aligned with routing areas of the display panel. The method further includes providing partially obstructed light through the routing areas of the display panel to the devices that are operable with partially obstructed light.

Light devices that are operable with partially obstructed light may alternatively be referred to as light devices that require partially obstructed light. It will be understood that light devices that are operable with partially obstructed light are light devices which can operate when receiving partially obstructed light, and do not require unobstructed light. Of course, such devices may also be capable of operation with unobstructed light. On the other hand, light devices which require unobstructed light are not operable when receiving partially obstructed light. Such devices which require unobstructed light may, for example, include cameras.

The routing areas of the display panel may include control lines that are rerouted around the apertures. The partially obstructed light provided through the routing areas may be partially obstructed by the control lines. The control lines may be data lines.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily drawn to scale and are may not be in scale relative to each other. Like reference numerals designate corresponding parts throughout the several views.

DETAILED DESCRIPTION

The present disclosure describes a configuration of a display panel (e.g., for a mobile computing device) that offers a variety of advantages, including (but not limited to) an extended viewing area. A display panel for a mobile computing device (i.e., computer device, mobile computer device, etc.) can be positioned behind a transparent cover glass (i.e., bezel) that forms the front surface of the mobile computing device. The mobile computing device can also include light devices that are configured to sense lighting conditions (e.g. light sensor), capture images (e.g., front-facing camera), and/or to provide light (e.g., flash) through the bezel. Traditionally, the display panel and the light devices occupy separate areas of the front surface. Recent advances in display technology (e.g., light emitting diode (OLED) displays) facilitate extending the emissive display area towards (e.g., to) the edges of the mobile device. By extending the display area of the device towards the edges of a device, a user may experience the benefits of a larger display without the drawbacks of a larger device. The disclosed techniques can be applied to expand the operable portion of a display panel towards the edges of a front surface of a mobile computing device while accommodating the collection/transmission requirements of light devices sharing the front surface of the device.

Figure 1:
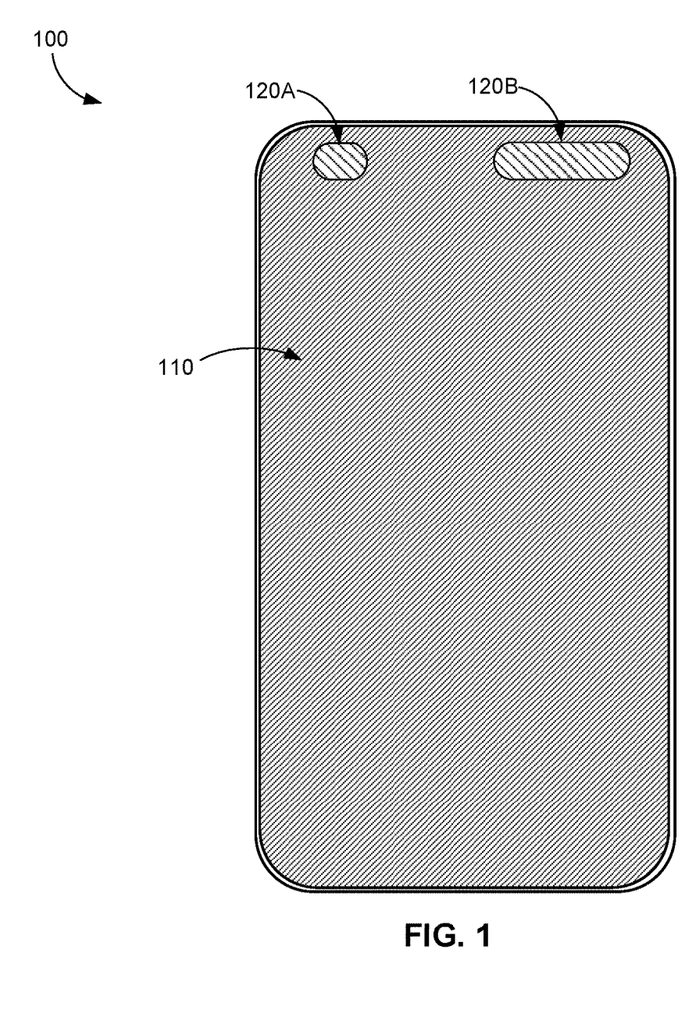
FIG. 1 depicts a possible front surface of a mobile computing device including a display panel with an emissive portion that surrounds non-emissive portions.

Some light devices positioned behind (i.e., under) the display may require unobstructed light for operation. Accordingly, the display panel may include one or more apertures to provide unobstructed light to these light devices. An example of a mobile computing device with a display panel extended towards the edges of the device and around areas used by light devices is shown in FIG. 1. The front surface of the mobile computing device 100 is shown. The front surface area of the display includes a display panel with an emissive (i.e., active) portion 110 that is configured to emit light (e.g., display images, graphics, and characters). The display panel may also include one or more non-emissive portions 120A, 120B that do not emit light. The locations of the non-emissive portions correspond to the locations of light devices.

Figure 2:
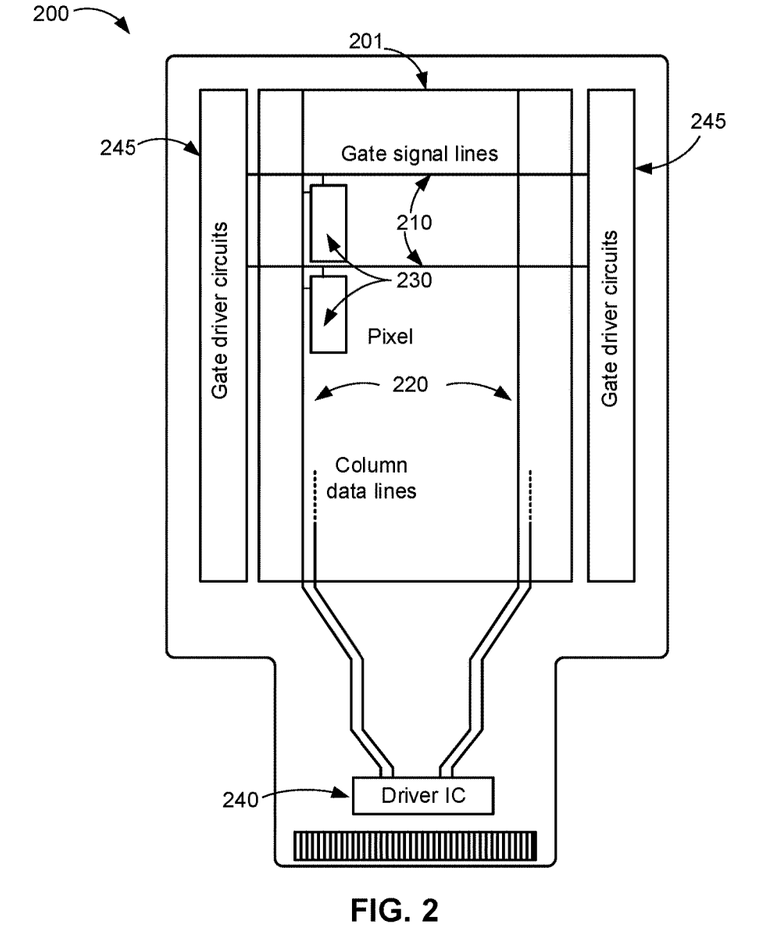
FIG. 2 schematically depicts a possible implementation of a display system for a mobile computing device.

A possible display system (i.e., display panel) that can be used with the mobile computing device 100 is shown in FIG. 2. The display system 200 may include an active area 201 of a display panel that is controlled by electronics to render a visual output (e.g., text, graphics, video, images, etc.). The active area 201 of the display panel includes rows and columns of pixels 230. The display panel 200 may include a matrix of thin film transistors (TFTs) with each pixel 230 of the display panel 200 coupled to one or more corresponding transistors from the matrix of TFTs. The one or more TFTs for each pixel can be controlled to adjust the light intensity of the pixel. For example, the pixels in a row of pixels can be enabled by a signal (e.g., voltage) transmitted by a gate driver circuit 245 over a gate signal line (i.e., signal line) 210. Once enabled, the intensity of each pixel in the row may be adjusted by a signal (e.g., voltage) transmitted by a driver IC 240 over a column data line (i.e., data line) 220 for each column of pixels. It will be appreciated that reference to gate signal lines (or signal lines) and column data lines (or data lines) may be used interchangeably. Moreover, data lines and signal lines may each be referred to as control lines.

Figure 3:
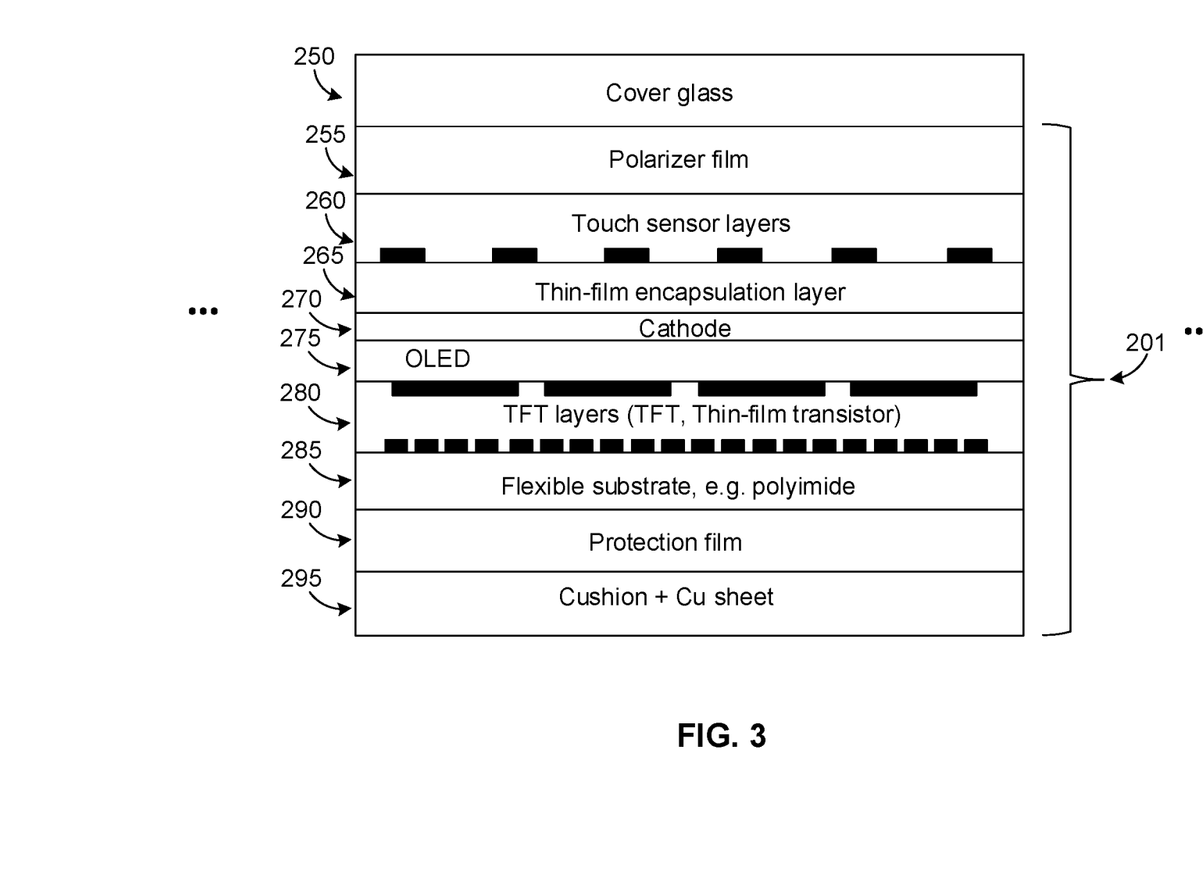
FIG. 3 depicts a side, cross-section view of an emissive (i.e., active) area of the display panel of FIG. 2.

FIG. 3 is a side, cross-sectional view of an active area 201 of the display panel suitable for use in the display system 200 of the mobile computing device 100. As discussed, the active area 201 includes layers that act as light emitting pixels and is positioned behind a cover glass 250 of the mobile computing device. The pixels 230 of the display panel 200 may be implemented variously. As shown in FIG. 3, the display panel may include a cathode layer 270 and an organic light emitting diode (OLED) layer 275 that can be configured (e.g., by an applied voltage) to emit light. The light emitted (i.e., the intensity) by the pixels can be controlled by transistors in layers of TFTs 280. These layers are supported by a flexible substrate (e.g., polyimide) 285 and encapsulated by thin-film encapsulation layers 265. A transparent touch sensor layer 260 including electrodes for detecting a touch can be integrated with the active area 201 of the display panel above (i.e., in front of) the light emitting layers. A polarizer film layer 255 may also be integrated with the active area 201 of the display panel to improve the visual appeal (e.g., contrast) of the pixels. The layers described may be mechanically supported by a protection film layer 290 and may be supported and cushioned by a cushion, copper (Cu) sheet layer 295. The layers can be positioned behind the cover glass 250 of the mobile computing device. The layers may be adhered (i.e., laminated) to each other and may be flexible.

Variations to the display panel implementation are possible and the present disclosure is not limited to the particular implementation shown in FIG. 3. For example, the present disclosure describes a display panel that includes an aperture (i.e., display aperture) formed through all or a portion of the layers of the active area 201 (i.e., active portion) of the display panel 200 to provide a path for light to reach light devices behind the display panel in the mobile computing device. Additionally, the present disclosure describes a display panel having a routing area that contains signal lines rerouted as a result of the aperture. This routing area may include a subset of the layers shown in FIG. 3. For example, the routing area may not include any light emitting layers (i.e., pixels) and/or may not include any TFT layers.

Figure 4:
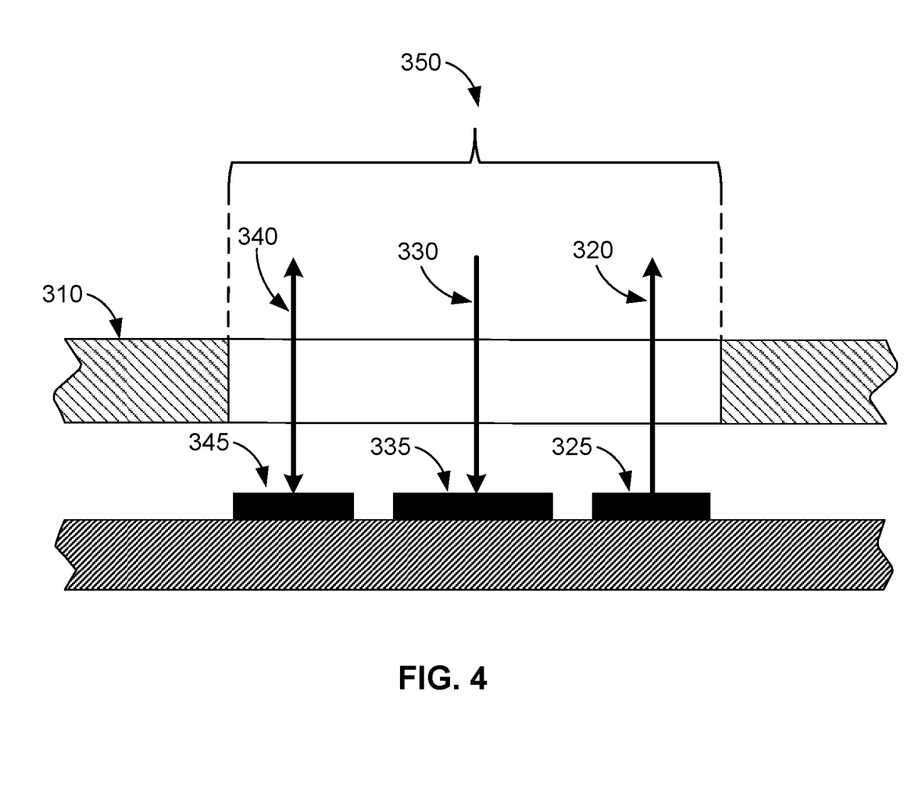
FIG. 4 depicts a possible side, cut away view of a portion of a mobile computing device having a single display aperture to accommodate a plurality of light devices.

FIG. 4 depicts a side, cut away view of a portion of a mobile computing device having a single display aperture to accommodate a plurality of light devices. As shown, a display panel 310 having an aperture 350 (i.e., through all layers) is positioned in front of a plurality of light devices 325, 335, 345. Each light device may be configured to emit (i.e., transmit, project) light, to receive (i.e., collect, absorb) light, or both transmit and receive light. For the example implementation shown in FIG. 4, the mobile computing device includes a first light device configured to transmit 320 light, a second light device 335 configured to receive 330 light, and a third light device 345 configured to transmit/receive 340 light. The light may be any wavelength or group of wavelengths in a visible light or infrared light portion of the spectrum. Alternatively, the light devices may be configured for other electromagnetic radiation (e.g., millimeter electromagnetic waves). Possible light devices may include (but are not limited to) sensors, cameras, camera flashes, and a flash light. Accordingly, the display panel 310 may include an aperture 350 to allow the plurality of light devices 325, 335, 345 transmit (i.e., emit) and/or receive (i.e., collect) light without obstruction from the display panel 310. In general, any number of light devices may be included in a mobile computing device and various combinations of their configurations (e.g., emitter, collector, both) may result. For example, a mobile computing device may include an ambient light sensor configured to receive light, a flood illuminator configured to transmit light, a camera configured to capture a visible image, and a proximity sensor configured to transmit and receive light.

Figure 5:
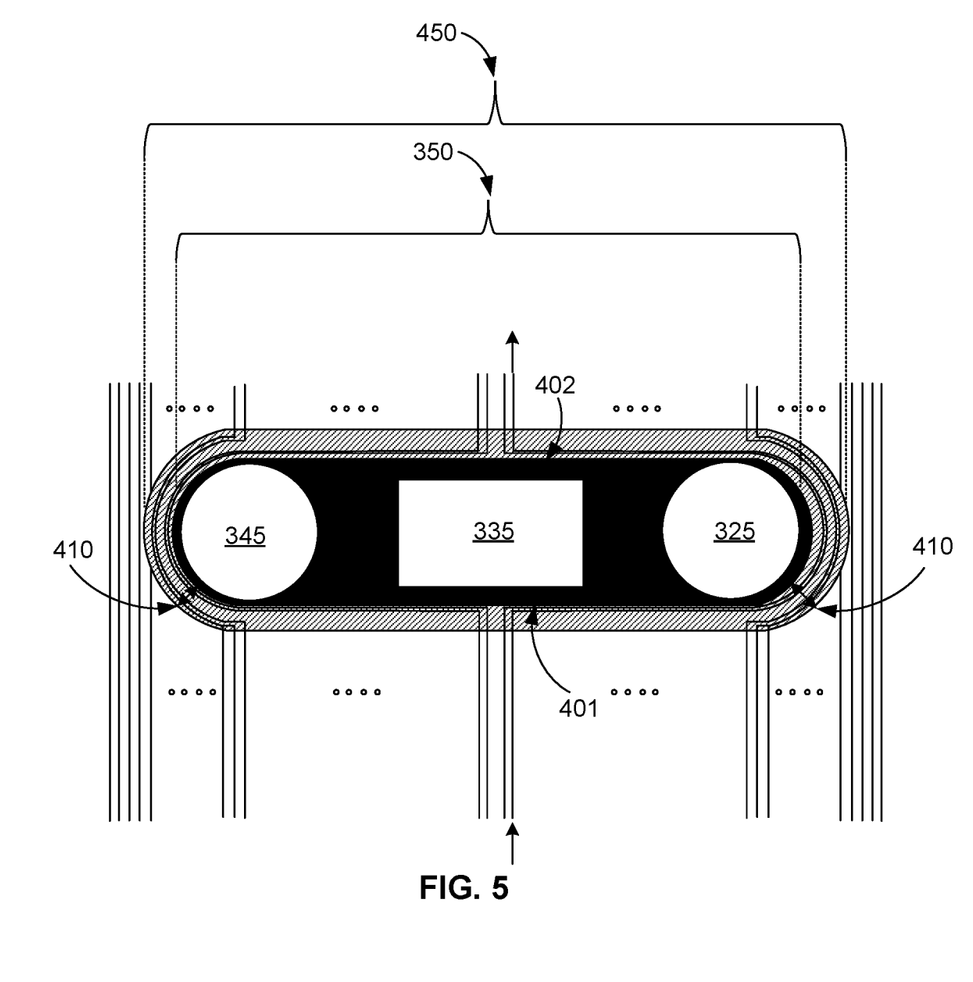
FIG. 5 depicts a front view of the portion of the mobile computing of FIG. 4.

FIG. 5 depicts a front view of the portion of the mobile computing shown in FIG. 4. The aperture 350 spans all light devices 325, 335, 345. To extend the display area, pixels exists on the display panel in areas surrounding the aperture 350. Accordingly, signals must be carried from a driver IC 240 (and/or the gate driver circuits 245) located on first side 401 of the aperture to pixels that are located on a second (e.g., opposite) side 402 of the aperture. As a result, data lines (and/or signal lines) must be routed around the aperture. To accommodate the routing, space (i.e., area) must be provided around the aperture. The display panel does not emit light in the area of the routing around the aperture. Thus, the display panel includes a non-emissive portion 450 that includes the aperture 350 and the routing area (i.e., gutter) 410 around the aperture. The routing area may also be referred to as the span around the aperture required for routing. The routing area contains data lines (and/or signal lines) carrying signals for pixels in emissive portions of the display but may not include pixels. As a result, the display panel in the routing area may include a subset of layers that are included in the emissive portion of the display panel.

As the aperture 350 is made larger to accommodate multiple light devices, more data lines (and/or signal lines) must be displaced. As a result, the non-emissive portion 450 of the display panel must be made larger to support the increased number of rerouted lines. In other words, the routing area 410 (i.e., gutter) around the aperture required for the routing can make the non-emissive portion of the display larger than acceptable when an aperture is made large enough to accommodate several light devices simultaneously.

The disclosed display panel approach limits the size of an aperture to prevent the routing area from becoming too large (i.e., to limit extent to which the emissive portion of the display is reduced). In other words, the disclosed display panel approach advantageously uses multiple apertures instead of one large aperture to provide unobstructed paths to at least one of a plurality of light devices of the mobile computing device.

Figure 6:
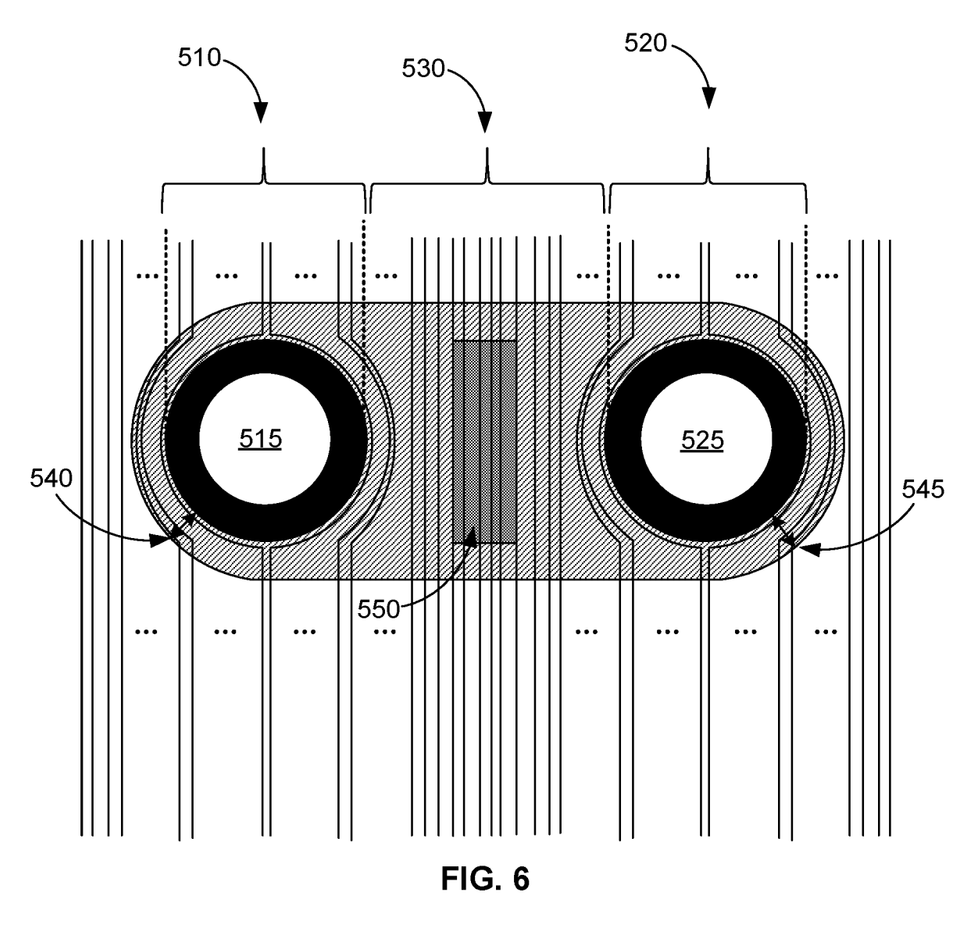
FIG. 6 depicts a possible front view of a portion mobile computing device having multiple display apertures and a routing area to accommodate a plurality of light devices.

FIG. 6 depicts a possible front view of a portion mobile computing device having multiple display apertures and a routing area to accommodate a plurality of light devices. Rather than one large aperture, the display panel includes multiple apertures to accommodate a plurality of light devices. In particular, the example illustrated includes a first aperture 510 and a second aperture 520, which are each sized smaller than the aperture of FIG. 5. For the example shown, each aperture provides an unobstructed light path to a single light device. The first aperture 510 provides an unobstructed path for light for a first light device 515, and the second aperture 520 provides an unobstructed path for light for a second light device 525. The first aperture 510 and the second aperture 520 shown are identically sized and shaped but this is not required. The disclosed display methods and techniques embrace any number of display apertures that may be shaped identically or that may be differently sized and shaped.

The first aperture 510 and the second aperture 520 define a routing area 530 between the apertures. The routing area 530 can be used to route data lines that would otherwise need to be rerouted around a single large aperture. The routing area 530 between the apertures is not emissive (e.g., includes no pixels). Accordingly, the non-emissive portion of the display includes the apertures, the gutters, and the routing area (areas in FIG. 6 shown as gray and black). The non-emissive portion of the display panel with multiple apertures is smaller than the non-emissive portion required for a single aperture because the required routing paths (i.e., gutters) around the perimeter of the apertures 540, 545 are smaller.

Figure 7:
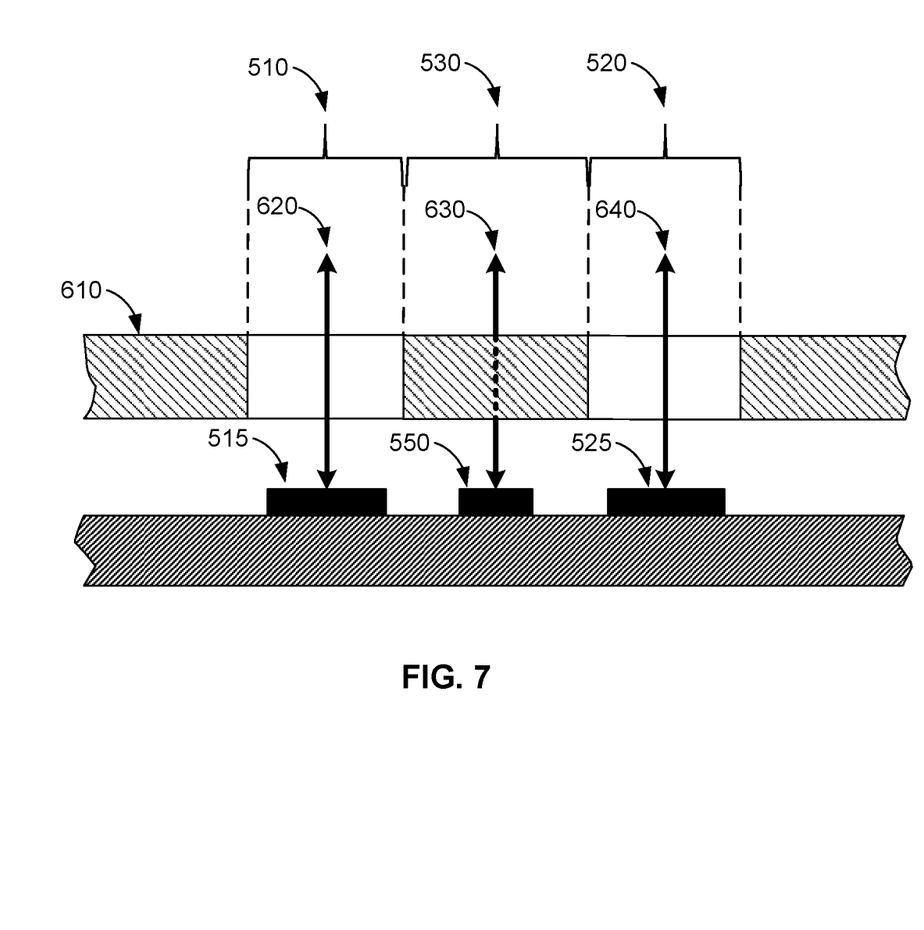
FIG. 7 depicts a side, cut away view of the mobile computing device of FIG. 6.

FIG. 7 depicts a side, cut away view of the mobile computing device of FIG. 6. The example implementation shown includes three light devices. A first light device 515 can be configured to transmit and/or receive light via a first unobstructed path 620 provided by the first aperture 510 in a display panel 610. A second light device 525 can be configured to transmit and/or receive light via a second unobstructed path 640 provided by the second aperture 520. A third light device 550 may be configured to transmit and/or receive light via an obstructed path 630 provided through the routing area 530 between the apertures. The routing area 530 includes data lines that partially obstruct light but may otherwise be transparent. For example, the routing area 530 may include no pixels, which could otherwise block light.

The disclosed display panel approach uses the routing area 530 as a light path 630 for a light device 550 because it is recognized that while the light traveling along this path may be reduced (e.g., due to reflection or scattering) a portion of the light propagates through the routing area unobstructed. Accordingly, the third light device 550 may be configured to operate with partially obscured light. For example, the third light device 550 may be configured to operate with a lower light intensity or may include added/different components (e.g., optics with larger aperture) or characteristics (e.g., increased gain) to compensate for the lost (i.e. blocked/scattered) light.

The multiple aperture plus routing area approach may also facilitate a touch sensitive portion (i.e., touch sensor layers) of the display panel being extended towards (e.g., to) the edges of the mobile computing device. The touch sensitive portion (i.e., touch sensor) of the display panel may include a first electrode layer with a first transparent conductor pattern (or non-transparent but mesh-shaped pattern with no metal pattern in the center) and a second electrode layer with a second transparent conductor pattern (or non-transparent but mesh-shaped pattern). The first electrode layer and the second electrode layer may be separated by a dielectric spacer (e.g., silicon dioxide). Alternatively, all touch sensor patterns may use the same metal layer. In this case, in regions where signals cross another metal layer is used as a bridge to prevent an electrical short (i.e., in the region where signals cross). When a user touches the surface the electric current running through the electrodes may change so that the location and duration of the touch may be sensed.

Figure 8:
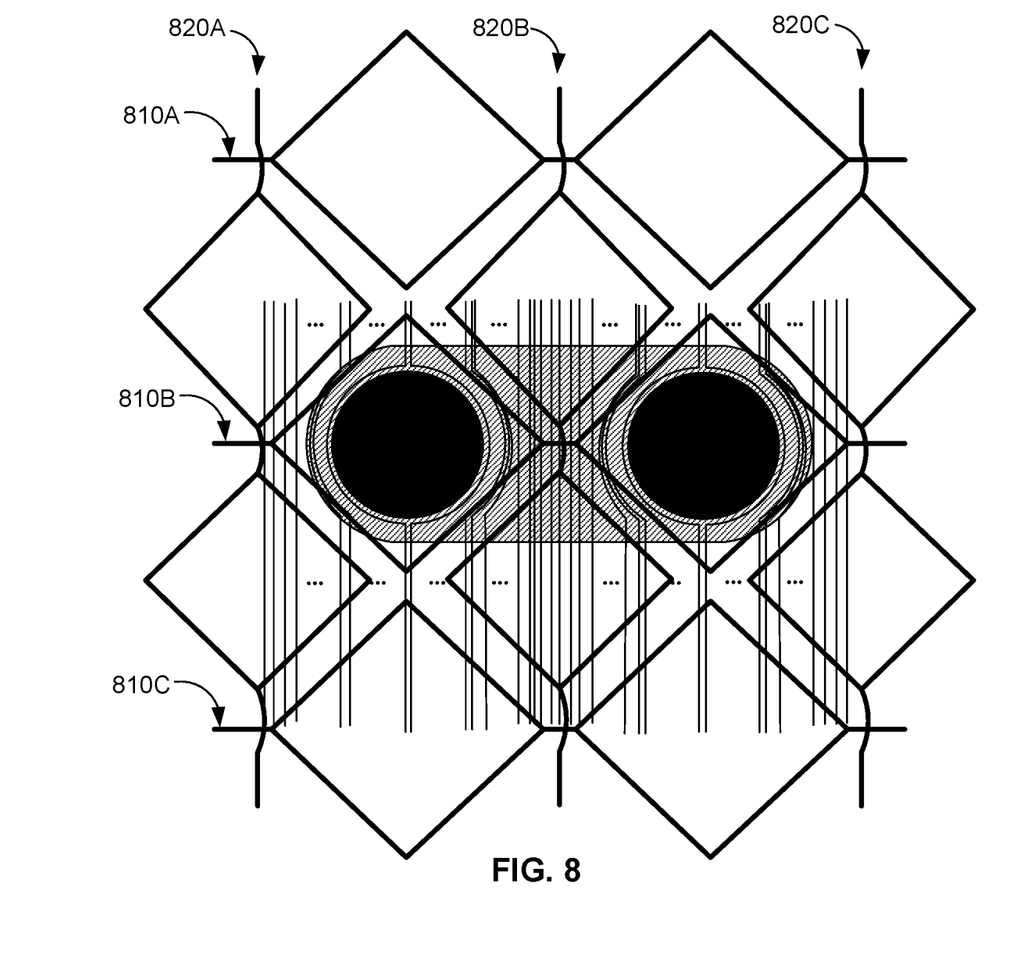
FIG. 8 depicts a possible arrangement of a touch sensor for integration with the mobile computing device of FIG. 6.

FIG. 8 depicts a possible arrangement of a touch sensor for integration with the mobile computing device of FIG. 6. The touch sensor includes rows 810A, 810B, 810C of an electrode pattern on a first layer and columns 820A, 820B, 820C of an electrode pattern on a second layer. Each electrode pattern includes transparent conductors forming unit cells (or mesh-shaped non-transparent conductors forming unit cells). The unit cells in a row or a column are interconnected by segments of conductors. The unit cells shown in the example implementation are square. The size and spacing of the unit cells may be chosen so the apertures are not covered by any conductor of the touch screen. For example, no conductor in the touch sensor row 810B overlaps with an aperture. This arrangement may facilitate fabrication as an aperture is a hole through layers in a display panel. The disclosed display panel approach prevents the electrodes of a touch screen from overlapping a physical opening formed in a display panel (i.e., in the touch sensor layers) for an aperture without affecting the operation of the touch sensor.

Figure 9:
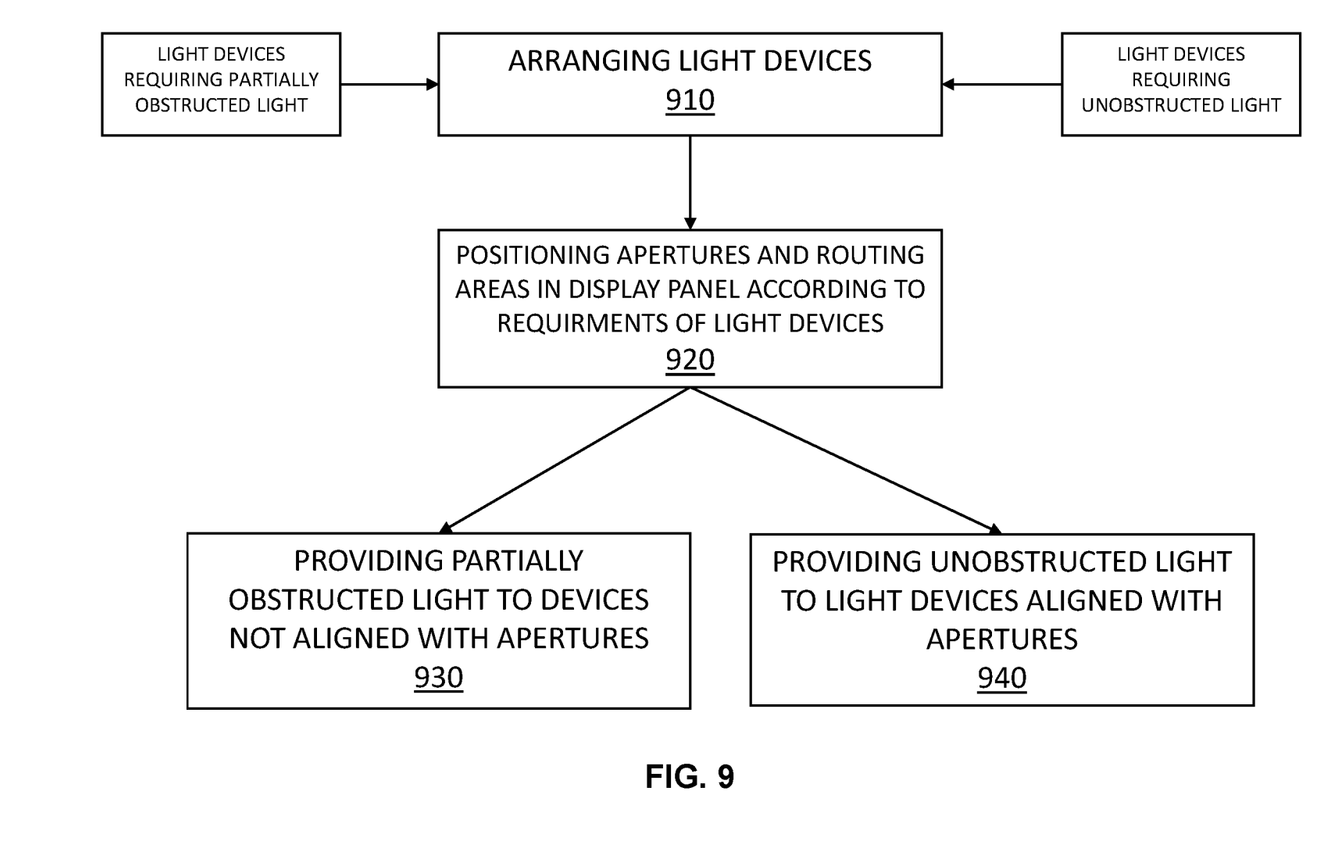
FIG. 9 is a flowchart of a method for providing light to a plurality of devices behind a display panel.

FIG. 9 is a flow chart of a method for providing light to a plurality of light devices. The method includes arranging 910 light devices so that light devices that can operate with partially obstructed light are positioned relative to (e.g., between) light devices that can (e.g., can only) operate with unobstructed light. The method further includes positioning 920 a display panel in front of the light devices according to the requirements of the light devices. For example, apertures and routing areas of the display panel may be positioned according to the requirements of the light devices so that the light devices that require unobstructed light are aligned with the apertures, while the light devices that require partially obstructed light are not aligned with the apertures. Instead, the light devices that require partially obstructed light may be aligned with routing areas of the display panel. The method further includes providing 930 partially obstructed light to the devices not aligned with the apertures. The light provided to the devices not aligned with the apertures can be provided through the routing areas where it is partially obstructed by data lines in the routing area as a result of being rerouted around the apertures. Additionally, unobstructed light may be provided 940 to the light devices aligned with apertures in the display panel.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Similarly, the display panel being described as being "above" the light emitting layers may refer to the orientation shown in the figures, it being appreciated that, in use, the device may be rotated such that the display panel is in fact below the light emitting layers.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A display panel including:
an emissive portion configured to emit light, and
a non-emissive portion configured to carry signals to the emissive portion;
wherein the non-emissive portion of the display panel is configured to permit light transmitted or received by at least one light device positioned behind the display panel to pass through the non-emissive portion of the display panel,
wherein the non-emissive portion includes an aperture through the display panel that is adapted to be positioned over a light device operable with unobstructed light, and
wherein the non-emissive portion includes a routing area that surrounds the aperture and includes control lines for the emissive portion, the routing area configured to be positioned over a light device operable with partially obstructed light.

2. The display panel according to claim 1, wherein the emissive portion includes a matrix of thin film transistors (TFTs) controlled by control lines to control light emission for pixels in the emissive portion.

3. The display panel according to claim 2, wherein the pixels are organic light emitting diodes (OLEDs).

4. The display panel according to claim 2, wherein the non-emissive portion includes the control lines for pixels in the emissive portion but is not configured to emit light, the control lines partially obstructing the light transmitted or received through the non-emissive portion.

5. The display panel according to claim 4, wherein the non-emissive portion includes no pixels.

6. The display panel according to claim 1, wherein the non-emissive portion includes an aperture through the display panel and a routing area that surrounds the aperture and that includes control lines for the emissive portion.

7. The display panel according to claim 6, wherein the light transmitted or received through the routing area partially is obstructed by the control lines.

8. The display panel according to claim 1, wherein the non-emissive portion includes a first aperture through the display panel and a second aperture through the display panel and a routing area that surrounds the first aperture and the second aperture and extends between the first aperture and the second aperture.

9. A display panel including:
an emissive portion configured to emit light, and
a non-emissive portion configured to carry signals to the emissive portion;
wherein the non-emissive portion of the display panel is configured to permit light transmitted or received by at least one light device positioned behind the display panel to pass through the non-emissive portion of the display panel,
wherein the non-emissive portion includes a first aperture through the display panel and a second aperture through the display panel and a routing area that surrounds the first aperture and the second aperture and that extends between the first aperture and the second aperture, and
wherein the routing area between the first aperture and the second aperture includes control lines for the emissive portion of the display panel routed around the first aperture or the second aperture.

10. The display panel according to claim 1, wherein the light is visible light, infrared light, or millimeter electromagnetic waves.

11. The display panel according to claim 1, wherein:
the emissive portion has an OLED display structure that includes a matrix of organic light emitting diode (OLEDs), a matrix of thin film transistors (TFTs) controlling an intensity of the matrix of OLEDs, and control lines carrying signals for controlling the matrix of TFTs;
the non-emissive portion comprises a routing area configured to carry signals for the emissive portion, the routing area of the display panel having a simplified OLED display structure that includes the control lines controlling the matrix TFTs; and
the routing area is partially obstructed by the control lines but otherwise transparent so light can pass partially obstructed through the routing area of the display panel to and from light devices.

12. The display panel according to claim 1, wherein the non-emissive portion is configured to be positioned over a light device operable with partially obstructed light.

13. The display panel according to claim 1, further including a plurality of apertures, each of the plurality of apertures configured to be positioned over a light device operable with unobstructed light.

14. A display panel including:
an emissive portion configured to emit light;
a non-emissive portion configured to carry signals to the emissive portion, wherein the non-emissive portion of the display panel is configured to permit light transmitted or received by at least one light device positioned behind the display panel to pass through the non-emissive portion of the display panel;
a plurality of apertures, each of the plurality of apertures configured to be positioned over a light device operable with unobstructed light; and
a touch sensor including electrodes arranged in a pattern of unit cells, each unit cell larger than any of the plurality of apertures so no electrode enters an area defined by an aperture.

15. A mobile computing device comprising: a display panel that includes:
an emissive portion configured to emit light;
a non-emissive portion configured to carry signals to the emissive portion,
wherein the non-emissive portion of the display panel is configured to permit light transmitted or received by at least one light device positioned behind the display panel to pass through the non-emissive portion of the display panel, wherein the non-emissive portion includes a first aperture through the display panel and a second aperture through the display panel and a routing area that surrounds the first aperture and the second aperture and that extends between the first aperture and the second aperture, and wherein the routing area between the first aperture and the second aperture includes control lines for the emissive portion of the display panel routed around the first aperture or the second aperture; and at least one light device positioned behind the display panel and configured to transmit or receive light through the non-emissive portion of the display panel, wherein one of the at least one light device is configured to transmit or receive light through the routing area between the first aperture and the second aperture, and wherein the light transmitted or received is partially obstructed by the control lines between the first aperture and the second aperture.

16. The mobile computing device according to claim 15, wherein the at least one light device includes a light sensor.

17. The mobile computing device according to claim 15, wherein the at least one light device includes a light emitter.

18. The mobile computing device according to claim 15, wherein the at least one light device includes a camera.

19. A method for providing light to a plurality of light devices in a mobile computing device, the method comprising:

arranging the plurality of light devices so that light devices that are operable with partially obstructed light are positioned relative to light devices that require unobstructed light;

positioning a display panel in front of the light devices so that the light devices that require unobstructed light are aligned with apertures in the display panel and so that the light devices that are operable with partially obstructed light are aligned with routing areas of the display panel; and providing partially obstructed light through routing areas of the display panel to the devices that are operable with partially obstructed light, wherein the routing areas of the display panel include control lines that are routed around the apertures, the partially obstructed light provided through the routing areas being partially obstructed by the control lines.

\* \* \* \* \*